United States Patent [19]

Kai

[11] Patent Number: 4,527,041
[45] Date of Patent: Jul. 2, 1985

[54] METHOD OF FORMING A WIRING PATTERN ON A WIRING BOARD

[76] Inventor: Kazuo Kai, 28-1, Kuwazu, 3-chome, Higashi Sumiyoshi-Ku, Osaka, Japan

[21] Appl. No.: 500,331

[22] Filed: Jun. 2, 1983

[51] Int. Cl.³ ............................................. B23K 26/00
[52] U.S. Cl. ............................. 219/121 LN; 29/846; 83/925 R; 361/406; 361/409; 430/319; 430/945
[58] Field of Search ................. 219/121 LH, 121 LJ, 219/121 EJ, 121 EK; 430/318, 319, 945; 29/846; 361/357, 406, 409; 83/925 R

[56] References Cited

U.S. PATENT DOCUMENTS 3,113,896 12/1963 Mann ........................ 219/121 LJ X
3,983,023 9/1976 Baker et al. ..................... 361/409 X

FOREIGN PATENT DOCUMENTS 1583192 1/1981 United Kingdom ......... 219/121 LH

Primary Examiner—C. L. Albritton
Attorney, Agent, or Firm—Koda and Androlia

[57] ABSTRACT

A method for forming a wiring pattern on a wiring board includes the steps of forming an electric conductive pattern having a width approximately equal to the space between IC pin insertion holes by a printing process or photocopying process and then cutting the pattern by a laser or mechanical means to form a plurality of wiring lines.

5 Claims, 3 Drawing Figures

METHOD OF FORMING A WIRING PATTERN ON A WIRING BOARD

BACKGROUND OF THE INVENTION

1. Field of the Invention

This invention relates to a method for forming a wiring pattern on a wiring board, especially for mounting thereon an integrated circuit.

2. Prior Art

The wiring boards for mounting ICs are formed with a wiring pattern not only around the IC but also between IC pin insertion holes in order to efficiently form the wiring pattern. Especially, in a case that the so-called CAD system is utilized to automatically form the pattern in high density, it is required that as many as possible wiring lines be interposed between the IC pin insertion holes.

The circuits in the conventional wiring pattern, however, have all been formed by an etching method (e.g., an etched foil method). As a result, the line width of the pattern is limited to a minimum, and the number of the wiring lines between the IC pin insertion holes are also limited to one or two at the maximum.

SUMMARY OF THE INVENTION

An object of the invention is to provide a wiring pattern forming method that can simply form two or more wiring lines between IC pin insertion holes on a board without using complex apparatus and process.

The objects of the present invention are accomplished by a unique method for forming a wiring pattern on a wiring board. The method includes the ordered steps of forming an electric-conductive pattern on the wiring board between insertion holes for integrated circuits. The conductive pattern has a width substantially equal to the spacing between the insertion holes. The conductive pattern is then cut into a plurality of fine wiring lines by a laser or mechanical means.

DETAILED DESCRIPTION OF THE INVENTION

An embodiment of a wiring pattern forming method of the invention will be described in accordance with the drawings.

Figure 1A:
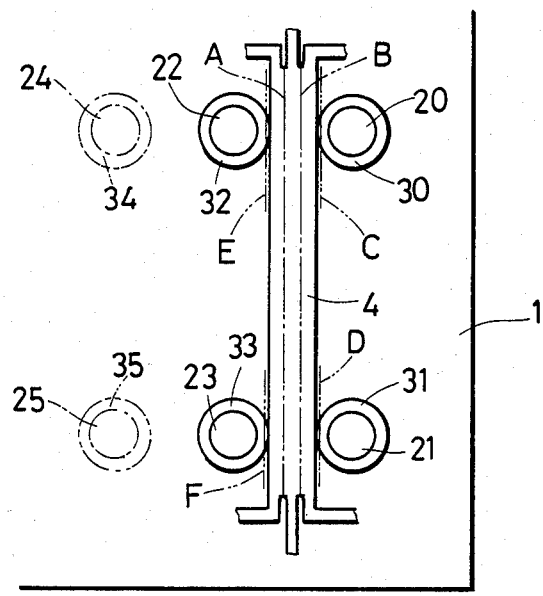
FIGS. 1(A) and 1(B) are explanatory views of a wiring pattern forming method of the invention.
Figure 1B:
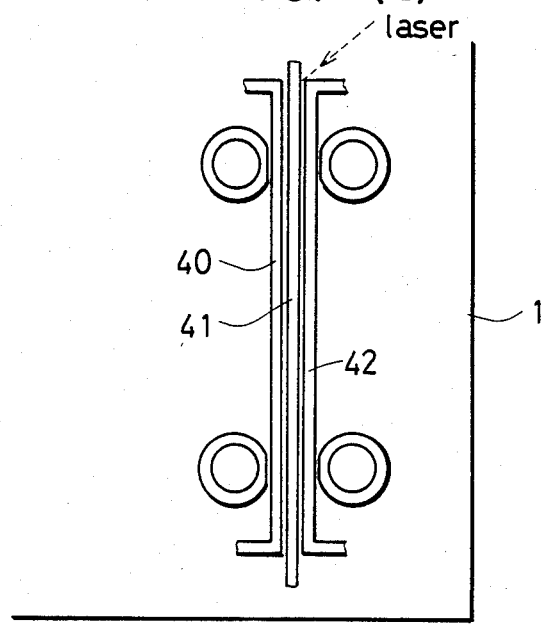

FIGS. 1(A) and 1(B) are explanatory views of the wiring pattern forming method of the present invention.

In FIG. 1(A), IC pin insertion through-holes 20 through 25 are formed on a wiring board 1, and electric-conductive patterns 30 through 35 for soldering are formed around each of the IC pin insertion holes 20 through 22, and 21 and 23 so as to contact with the electric-conductive patterns 30 through 33. Such electric-conductive patterns 30 through 35 and 4 are formed by a screen print method or photocopying method, for example, by using copper coating laminated sheets as the board.

Figure 2:
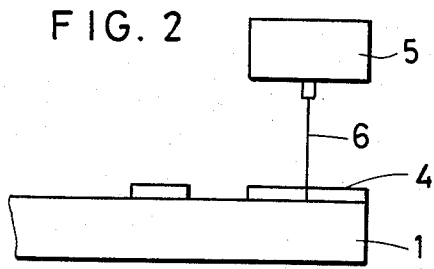
FIG. 2 is a schematic view of an apparatus for putting the method into practice.

Upon completion of the aforesaid first step of the pattern formation, the subsequent cutting process for electric-conductive patterns 4 start. The pattern-cutting process is carried out by a laser beam, and a laser oscillator therefor uses a carbon dioxide gas laser oscillation apparatus of relatively high power. FIG. 2 is exemplary of the positional relation between the board and the laser oscillator when the patterns are cut. In the same drawing, numeral 5 is a laser oscillator, and 6 is a laser beam. In this positional relation the laser oscillator 5 is moved relative to the board 1, or the laser beam 6 is optically refracted to sweep and cut the electric-conductive patterns 4. More specifically, in this example, the electric-conductive pattern shown in FIG. 1(A) is first cut lengthwise along the cutting lines A and B, and then the patterns 30 through 33 are cut along the cutting lines C, D, E, and F, thereby forming three wiring lines 40, 41, and 42 as shown in FIG. 1(B).

Thus, the electric-conductive patterns are first formed by the ordinary printing process or photocopying process, and thereafter a laser beam is applied to cut the patterns into the predetermined number of wiring lines. As a result, the patterns can be cut extremely precisely and at very small intervals, because the laser beam is very fine. Accordingly, by merely controlling the relation of relative position between the board 1 and the laser beam 6 accurately, many wiring lines, even if the conductive patterns 4 are not so large in width, can be formed. In a case of utilizing the conventional ething method, the wiring lines are corrosible laterally, but the laser beam cuts the patterns only longitudinally so that the line edge after being cut becomes nearly vertical. This is advantageous in that the limited width of the line is made further smaller.

Thus, the patterns in the first step are formed by the same method as the conventional method, and the simple projection of the laser beam in the second step cuts the electric-conductive patterns in the predetermined lines to complete the wiring patterns. Therefore, wiring patterns of a very fine line between the IC insertion holes can be formed in a short time. In addition, the above embodiment uses a laser as a desired cutting tool, but a mechanical cutting tool such as a diamond cutter may be used in place of the laser.

As seen from the above, according to the invention a board having many wiring lines between the IC pin insertion holes can be formed only by using simple apparatus without complicating the manufacturing process. Hence, the method of the invention is advantageous in that, even in a case of mounting IC or LSI on a board the area for wiring thereon can be enlarged, the wiring efficiency can be improved, and the board can be made small in size to result in low manufacturing cost.

I claim:

1. A method for forming a wiring pattern on a wiring board comprising the ordered steps of:

forming an electric conductive pattern on said wiring board between insertion holes in said wiring board for integrated circuits, said conductive pattern having a width substantially equal to a spacing between said holes; and cutting said conductive pattern to form a plurality of fine wiring lines.

2. A method according to claim 1, wherein said conductive pattern is formed by a printing process.

3. A method according to claim 1, wherein said conductive pattern is formed by a photocopying process.

4. A method according to claim 2 or 3 wherein said conductive pattern is cut by a laser into said plurality of wiring lines.

5. A method according to claim 2 or 3, wherein said conductive pattern is cut by a mechanical means into said plurality of wiring lines.

* * * * *